US011419226B1

(12) United States Patent
Guduru et al.

(10) Patent No.: US 11,419,226 B1
(45) Date of Patent: Aug. 16, 2022

(54) RACK-CHASSIS INTERLOCK SYSTEM

(71) Applicant: ZT Group Int'l, Inc., Secaucus, NJ (US)

(72) Inventors: Harshita Guduru, Secaucus, NJ (US); Sarah Kaus, Secaucus, NJ (US); Ryan Signer, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 17/351,578

(22) Filed: Jun. 18, 2021

(51) Int. Cl.
*H05K 7/14* (2006.01)
*H05K 5/02* (2006.01)
*A47B 97/00* (2006.01)
*E05B 65/464* (2017.01)

(52) U.S. Cl.
CPC ......... *H05K 5/0208* (2013.01); *H05K 7/1489* (2013.01); *A47B 2097/008* (2013.01); *E05B 65/464* (2013.01)

(58) Field of Classification Search
CPC ............... H05K 5/0208; H05K 7/1489; A47B 2097/008; E05B 65/464
See application file for complete search history.

(56) References Cited

U.S. PATENT DOCUMENTS

| 6,109,708 | A | * | 8/2000 | Walla | E05B 65/464 312/216 |
| 6,615,993 | B1 | * | 9/2003 | Rudiger | H05K 7/1489 211/175 |
| 8,297,723 | B2 | * | 10/2012 | Chen | E05B 65/463 312/333 |
| 9,861,196 | B2 | * | 1/2018 | Chen | A47B 88/50 |
| 10,676,964 | B2 | * | 6/2020 | Milligan | E05B 65/464 |
| 2008/0106175 | A1 | * | 5/2008 | Huang | E05B 65/464 312/217 |
| 2012/0187816 | A1 | * | 7/2012 | Chen | E05B 65/463 312/334.8 |
| 2015/0035294 | A1 | * | 2/2015 | Milligan | E05B 65/462 292/201 |
| 2017/0079428 | A1 | * | 3/2017 | Chen | H05K 7/1489 |

\* cited by examiner

*Primary Examiner* — Kimberley S Wright
(74) *Attorney, Agent, or Firm* — Todd A. Noah; Dergosits & Noah LLP

(57) ABSTRACT

An interlock system is provided that limits the ability of a user or seismic event to dislodge or partially remove more than one chassis from a rack at any one time. Thus, embodiments reduce the potential for the rack to be toppled by the weight of too many chassis extending from the rack at the same time. The interlock system includes a dynamic rail with locking blocks that move to engage hooks on the rear of the chassis. A trigger at each chassis slot is depressed with installation of a chassis. Upon the removal of any chassis, the associated trigger extends and causes the dynamic rail to be pulled down into a locking position in which the locking blocks engage the hooks on the remaining chassis, which prevents their removal.

14 Claims, 8 Drawing Sheets

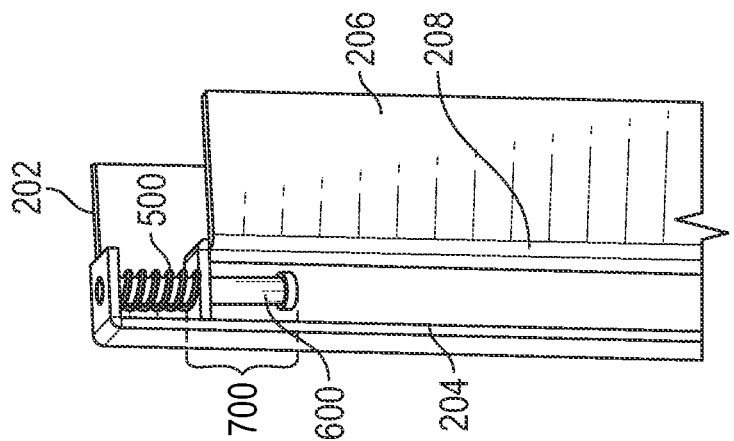
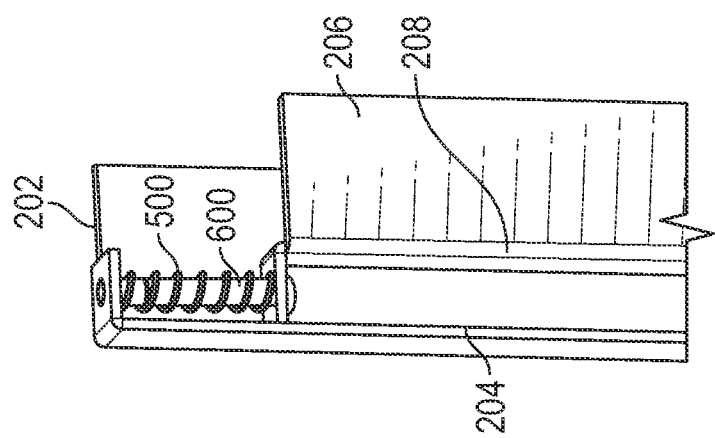
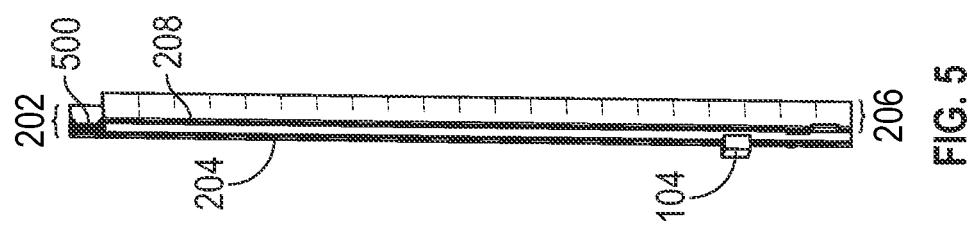

RACK-CHASSIS INTERLOCK SYSTEM

BACKGROUND

In systems with multiple rack-mounted devices, each slot within a rack is typically accessible individually for the removal or installation of a device chassis, e.g., a server. During service or installation, a chassis may then be partially inserted into, or withdrawn from, its slot (and only from the front). The partial insertion of the chassis results in that being cantilevered from the rack, which creates a tipping moment. With each chassis having the potential to be in the partially-inserted position, it creates the potential that the sum of the tipping moments may cause the rack to topple.

Similarly, seismic events may dislodge one or more chassis and cause them to be partially inserted. This may again create the potential that the sum of the tipping moments may cause the rack to topple.

Thus, what is needed is an apparatus that limits the number of chassis that may be partially-inserted, thereby limiting the tipping moment that may be applied to the rack by chassis and improving the stability of the rack during both normal operation and seismic events.

BRIEF DESCRIPTION OF THE DRAWINGS

The embodiments are illustrated by way of example and not limitation in the accompanying drawings, in which like references indicate similar elements, and in which:

FIG. 5 is an isometric right front view of aspects of the system of FIG. 1;

FIG. 6 is an isometric right front view of details of FIG. 5;

FIG. 7 is an isometric right front view of details of FIG. 5;

DETAILED DESCRIPTION

Embodiments described within disclose an interlock system that limits the ability of a user to partially remove multiple chassis from a rack at the same time. Similarly, the system limits the ability of a seismic event to dislodge multiple chassis from the rack at the same time. Thus, embodiments of the interlock system limit the potential that a rack may fall over due to partially installed or dislodged chassis.

Figure 1:
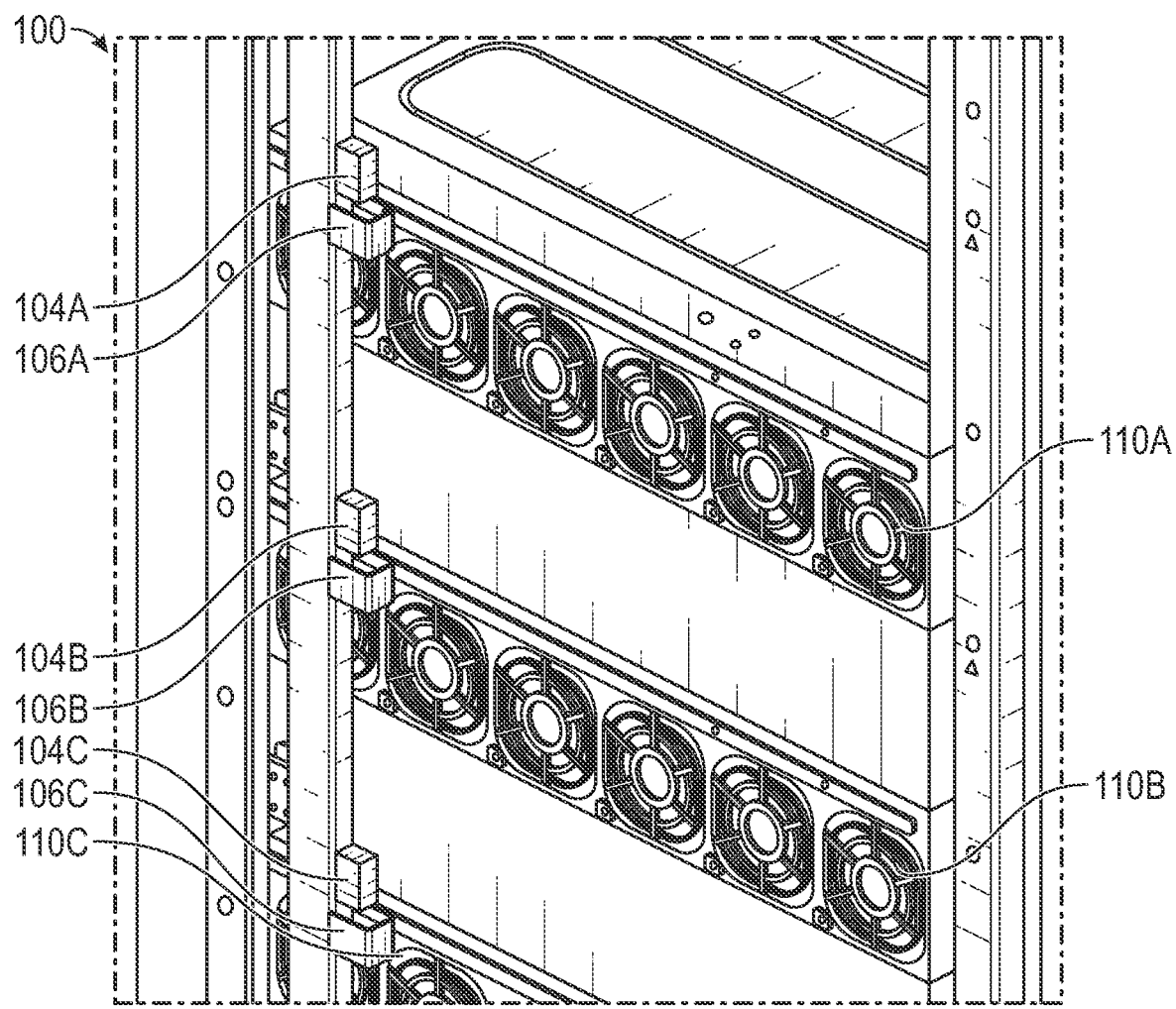
FIG. 1 is an isometric right rear view of an embodiment of an interlock system.

FIG. 1 is an isometric right rear view of an embodiment of an interlock system 100 mounted to a rack 120. Interlock system 100 includes blocks 104A, 104B, 104C and corresponding hooks 106A, 106B, 106C. Each hook 106A . . . 106C is attached to the rear of a corresponding chassis 110A, 110B, or 110C. Removal of one of the chassis activated interlock 100 by causing each block 104A . . . 104C to drop within and engage the corresponding hook 106A . . . 106C. So engaged, if a user attempts to remove a second chassis, the hook of that chassis will be blocked from moving forward and the chassis will be retained with the rack. Thus, sliding a single chassis to position in which the chassis extends from the rack, e.g., for servicing, causes interlock system 100 to engage and retain all remaining chassis. Additional chassis may not be extended, which prevents the user from accidentally destabilizing the rack system.

Figure 2:
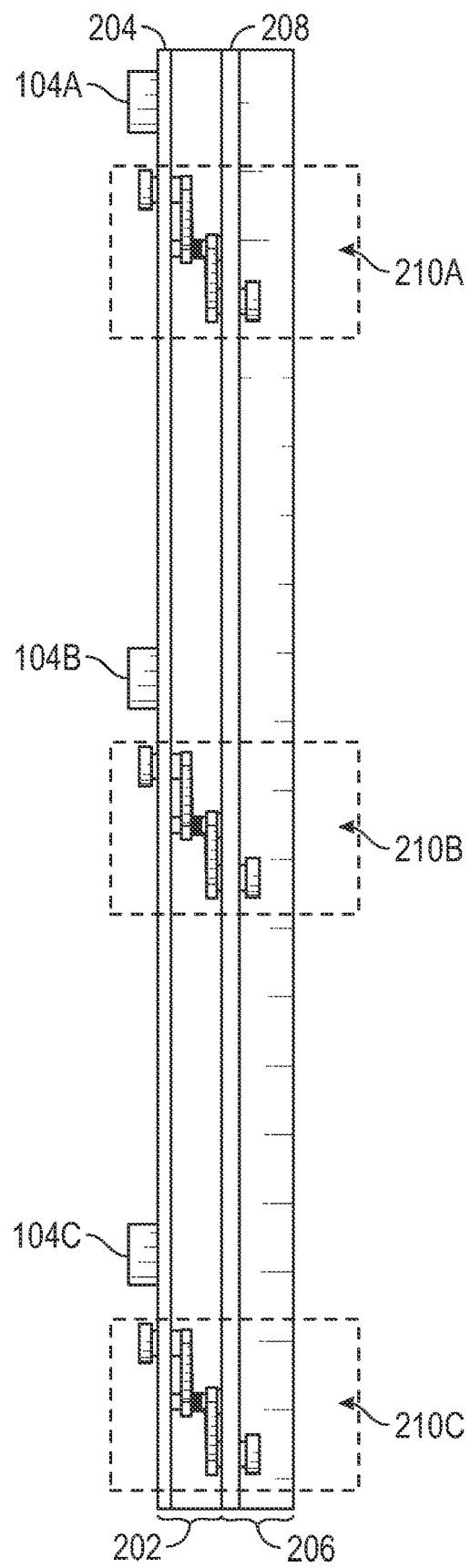
FIG. 2 is a front view of the embodiment of FIG. 1.

FIG. 2 is a front view of interlock system 100 of FIG. 1. In FIG. 2, interlock system 100 is shown to include a dynamic bar 202 and a static bar 206. Dynamic bar 202 further includes a rail 204 and static bar 206 includes a rail 208. Static bar 206 is attached to rack 120. Blocks 104A . . . 104C are attached to dynamic bar 202. Connected between rail 204 and rail 208 are trigger lever sets 210A . . . 210C. The removal of a chassis from rack 120 triggers the associated trigger lever set, which causes interlock system 100 to actuate. The actuation involves the following. Dynamic bar 202 moves downward with respect to static bar 206, the movement causing blocks 104A . . . 104C to descend as well. Blocks 104A . . . 104C descend into a space in front of their respective hook 106A . . . 106C, except for the hook that was removed along with its chassis. Interlock system 100 is now actuated. The presence of a block in front of a hook prevents that hook from going forward, preventing the attached chassis from being slid forward as well.

FIG. 2, FIG. 3, FIG. 6, and FIG. 7 illustrate that with interlock system 100 attached to rack 120 by static bar 206, dynamic bar 202 moves with respect to static bar 206. Thus, dynamic bar 202 and static bar 206 may be perforated, each with a hole, such that the holes align in the unlocked configuration (FIG. 1, FIG. 3, FIG. 5, FIG. 6), providing for a pin 216 to be inserted and maintain interlock system 100 in a raised and disabled position. With static and dynamic bars 202, 206 raised, and the pin inserted, blocks 104A . . . 104C are maintained at a raised position that prevents them from engaging hooks 106A . . . 106C even if one of trigger lever sets 210A . . . 210C is triggered. With interlock mechanism 100 raised and disabled in such a manner, multiple chassis may be installed or removed and rack 120 may be loaded or unloaded. To enable interlock system 100, the pin may be removed. With the pin removed, and with chassis installed in each slot and each trigger lever set 210A . . . 210C reset (or cocked), blocks 104A . . . 104C are positioned in the raised, unlocked positions shown in FIGS. 1 and 3.

Figure 3:
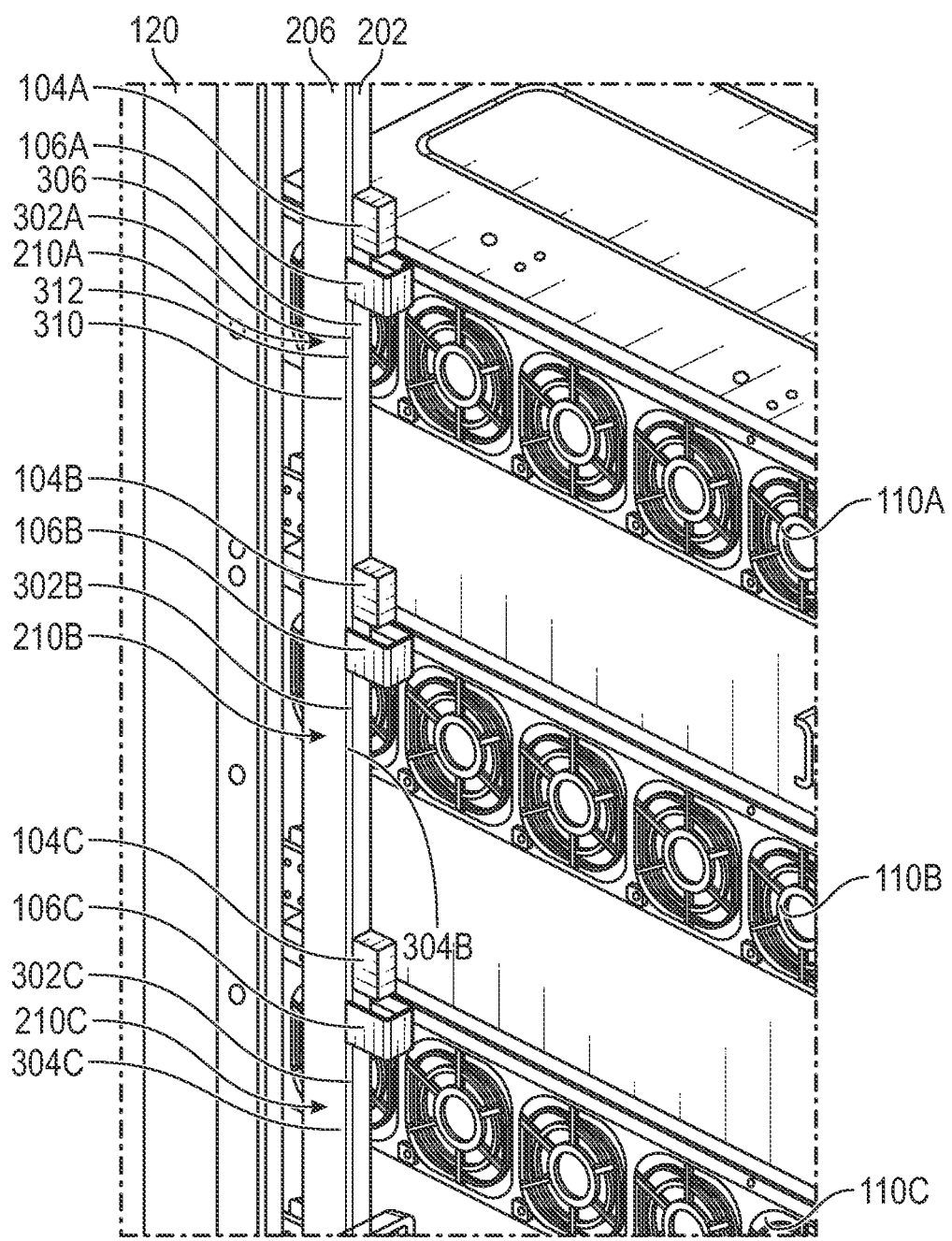
FIG. 3 is a partially-transparent isometric right rear view of the system of FIG. 1.

FIG. 3 is a partially-transparent isometric right rear view of interlock system 100 of FIG. 1 in which system 100 is unlocked. In FIG. 3, dynamic bar 202 has been rendered transparent to further illustrate trigger lever sets 210A . . . 210C. Each trigger lever set 210A . . . 210C includes the same elements, which will be described with regard to trigger lever set 210A. Set 210A includes a first lever 302 and a second lever 304. Lever 302 is pivotally connected at one end to rail 204 by a pin 306. Lever 302 is pivotally connected at the other end to a lever 304 by a pin 308. Lever 304 is pivotally connected to rail 208 by a pin 310. A spring 312 about pin 308 biases levers 302, 304 such that, upon removal of chassis 110A, pin 308 is urged forward by the spring bias. In other words, chassis 110A, when fully inserted into the rack, depresses pin 308 so that levers 302, 304 are roughly parallel. The removal of chassis 110A releases pin 308 forward, allowing levers 302, 304 to assume an angled orientation. The angled orientation brings pins 306, 310 closer together. Pin 306, being attached to dynamic bar 202, moves down toward pin 310, which is attached to static bar 206. Thus, when triggered, pin 306 moves dynamic bar 202, and dynamic bar 202 moves blocks 104A . . . 104C to engage the remaining hooks of 106A . . . 106C.

Figure 4:
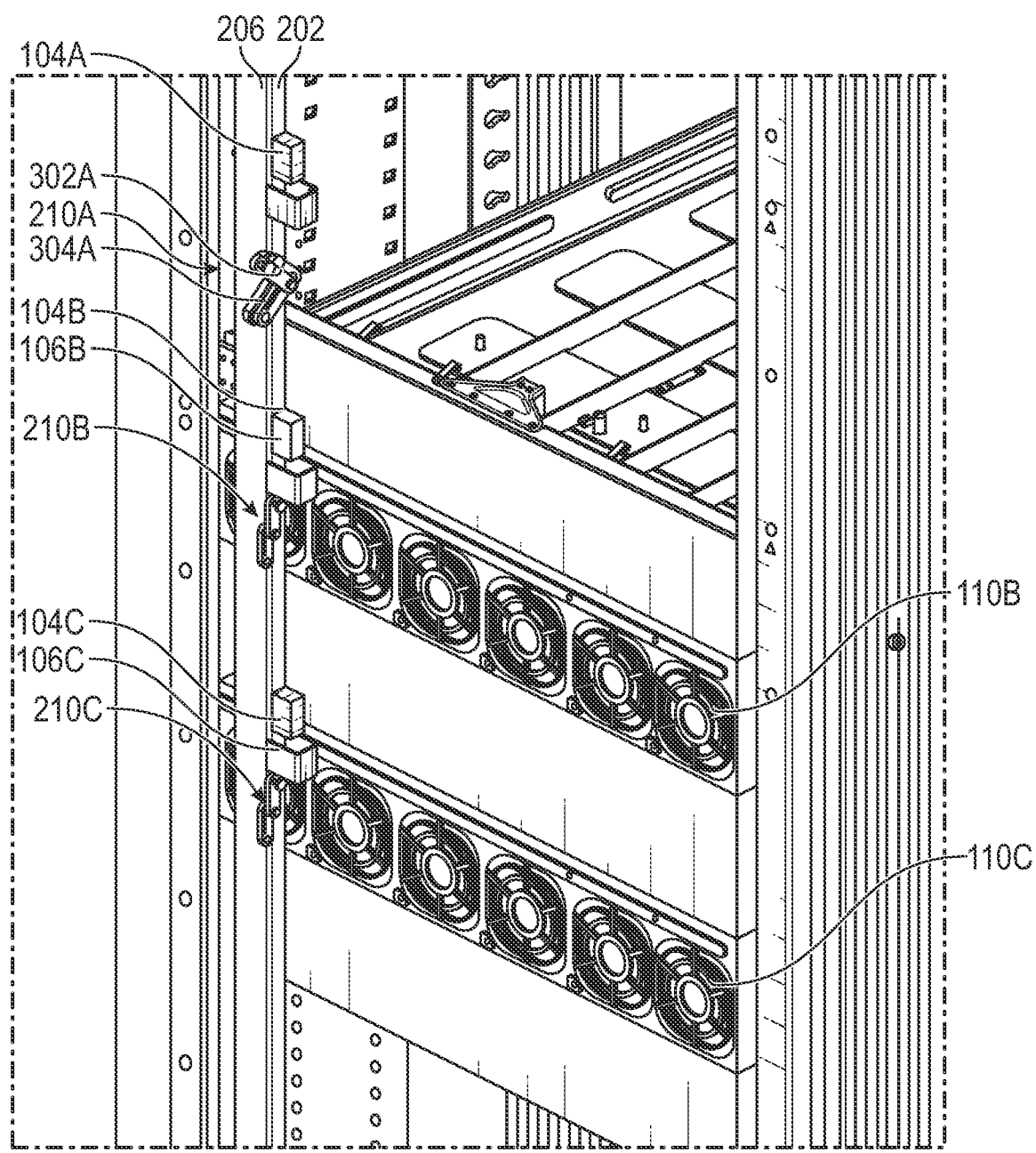
FIG. 4 is a partially-transparent isometric right rear view of the system of FIG. 1.

FIG. 4 is a partially-transparent isometric right rear view of interlock system 100 in an actuated/locked state. In FIG. 4, dynamic bar 202 has been rendered transparent to further illustrate trigger lever sets 210A . . . 210C. In FIG. 4, chassis 110A has been removed, which triggered trigger lever set 210A. As a result, levers 302A, 304A have assumed the angled configuration caused by the bias of spring 312. The angled configuration has drawn dynamic bar 202 and blocks 104A . . . 104C downward. Block 104B has dropped in front of hook 106B and block 104C has dropped in front of hook 106C. Hook 106A travelled forward with chassis 110A. Thus, both chassis 110B and 110C are locked into rack 120 upon the removal of chassis 110A. Similarly, given an initial configuration in which all three chassis 110A . . . 110C were present, the removal of either chassis 110B or 110C would have triggered interlock system 100 and caused the remaining chassis to be locked within rack 120.

With regard to FIG. 4, the unlocking of interlock system 100 may be achieved by reinstalling chassis 110A into the empty slot. As chassis 110A encounters and depresses trigger lever set 210A, upper lever 302A and lower lever 304A are flattened so that they are parallel, or substantially parallel, akin to trigger lever sets 210B, 210C. As trigger lever set 210A is depressed, dynamic bar 202 is forced upward with respect to static bar 206 and each block 104A . . . 104C is similarly raised. In this manner, blocks 104B, 104C are removed from the locked positions within hooks 106B, 106C, shown in FIG. 4, to the unlocked positions of FIG. 3.

FIG. 5 is an isometric right front view of aspects of interlock system 100 of FIG. 1. FIG. 5 illustrates further aspects of the movement of dynamic bar 202 and static bar 206. With static bar 206 connected to rack 120, dynamic bar 202 moves with respect to static bar 206. Dynamic bar 202 is biased by an "unlocking" spring 500 to extend upward relative to static bar 206. Thus, trigger lever sets 210A . . . 210C, when activated, work against unlocking spring 500 to cause blocks 104A . . . 104C (represented as a group by a block 104 attached to rail 204) to drop into the locking position. For that reason, each spring 312 is configured to provide a bias force that is sufficient to cause the associated trigger lever set to overcome the bias of unlocking spring 500 when triggered (released). FIG. 6 is an isometric right front view of details of FIG. 5. In FIG. 6, dynamic bar 202 is in the untriggered or unlocked state above static bar 206 such that unlocking spring 500 has caused bar 202 to extend to the travel limit of a travel-limiting pin 600. In FIG. 7, dynamic bar 202 is in the triggered or locked state and has moved closer to the top of static bar 206 such that pin 600 indicates that a distance 700 of upward travel remains available to dynamic bar 202.

Figure 8:
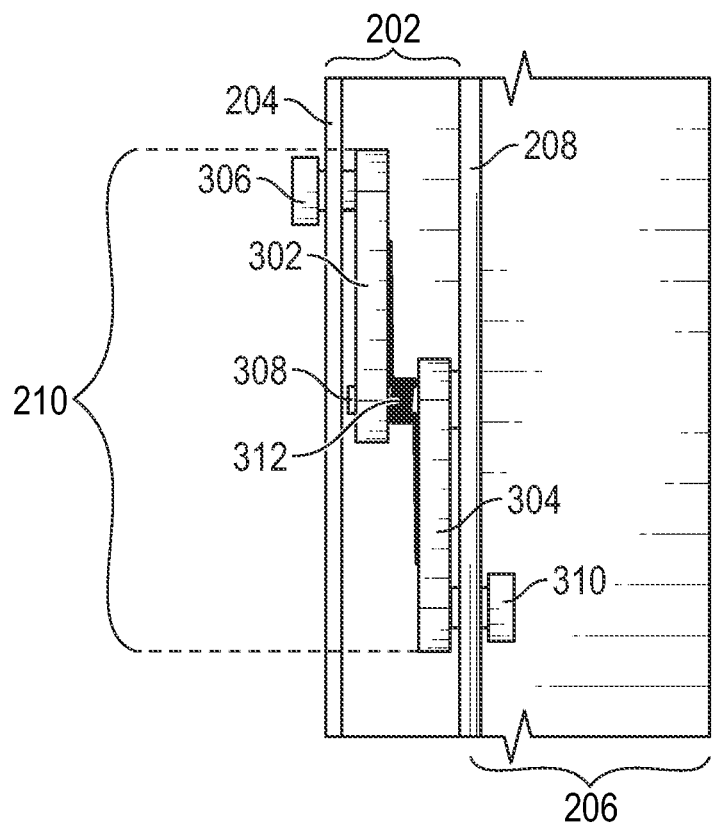
FIG. 8 is a front view of aspects of the system of FIG. 1.

FIG. 8 is a front view of aspects of interlock system 100, in particular an exemplary trigger lever set 210, in which system 100 is unlocked. In FIG. 8, spring 312 is shown positioned about pin 308 and between levers 302, 304. As shown, spring 312 works against arms 302, 304 so that pin 308 extends forward (out of the page) when released. Upon trigger lever set 210 being released, pin 306 is drawn downward toward pin 310. Pin 306 pulls dynamic bar rail 204 (and the attached blocks 104A . . . 104C) down with it.

Figure 9:
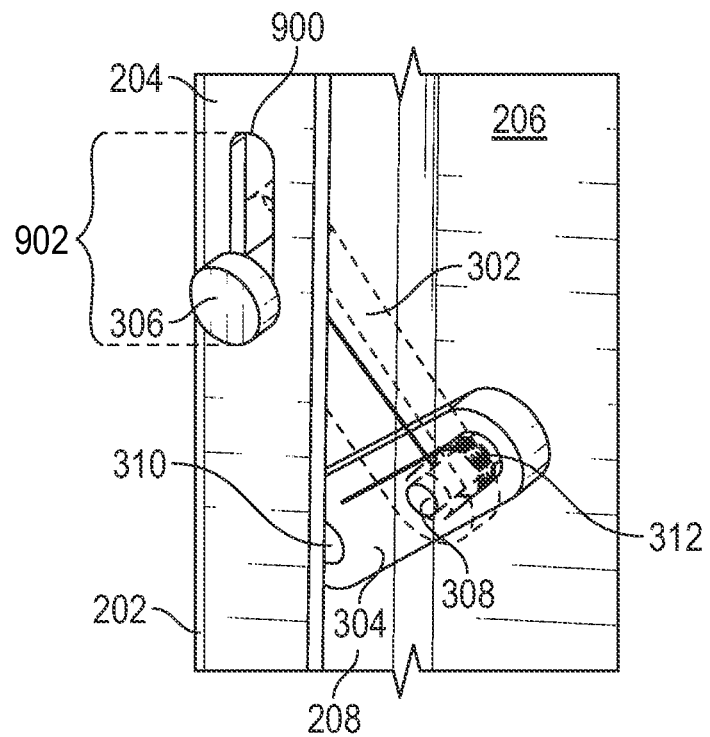
FIG. 9 is an isometric right front of aspects of the system of FIG. 1.

FIG. 9 is an isometric right front of aspects of interlock system 100. In FIG. 9, trigger lever set 210 has been triggered and the system is locked. Thus, pin 308 has been released and urged forward (to the right as shown) by the bias of spring 312. On being triggered, pin 306 and the bias of spring 312 overcome the bias of unlocking spring 500 (FIG. 5) and pull dynamic bar 202 downward. With the downward movement of dynamic bar 202, blocks 104A . . . 104C descend into the locking position in front of a hook.

The purpose of slot 900 and a travel 902 is to allow for dynamic bar 202 to be pulled down by the triggering of one trigger set while the remaining trigger sets are still depressed by chassis. For example, removal of chassis 110A releases trigger lever set 210A, but not trigger lever sets 210B, 210C. Trigger lever sets 210B, 210C remain depressed. For trigger lever sets 210B, 210C the associated slot 902 allows dynamic bar rail 204 and blocks 104A . . . 104C to descend into the locked position. In the embodiment, blocks 104A . . . 104C are sized to be thin enough with respect to hooks 106A . . . 106C that forward movement of a chassis being removed causes the hook of that chassis to leave the path of travel of the associated block before the block engages or hits the hook. That is, in the embodiment, the forward movement by a chassis being removed releases the associated trigger lever set 210 and causes pin 306 to pull dynamic bar 202 and the blocks downward. That same forward movement causes the hook of the chassis being removed to move out of the path of the descending block.

In an embodiment, slot 900 allows for some movement of a trigger lever set 210 before pin 306 engages and pulls down dynamic rail 204. In the embodiment, with dynamic rail 204 in the unlocked position and trigger lever sets 210A . . . 210C depressed (shown in FIG. 2), slot 900 extends both above and below each of pins 306. In the embodiment, with pin 306 in the flat, depressed position (e.g., as shown in FIGS. 2, 3, and 8, and 210B and 210C of FIG. 4) slot 900 may extend below pin 306 to allow some downward movement of pin 306 before dynamic rail 204 is engaged and blocks 104A . . . 104C begin to move. The extension of slot 900 below pin 306 may be sized to allow for enough forward movement of a chassis so that the hook of the chassis may clear the block that is about to descend. Upon the hook clearing the associated block's path, further forward movement of the chassis causes pin 306 to pull rail 204 and the blocks into the locked positions. In other words, travel 902 may be enlarged so that it extends above and below a pin 306 (when depressed) and allows pin 306 an initial amount of movement before the end of slot 902 is engaged, where the initial amount of movement is enough to allow the hook to move forward and clear the associated block. Subsequent movement of pin 306 then causes movement of rail 204 and the blocks that prevent removal of the remaining chassis. In the embodiment, slot 900 and an enlarged travel 902 serve two functions: 1) provide enough travel (below pin 306) that an initial chassis may be removed without a hook interfering with the removal; and 2) provide enough travel above pin 306 (of depressed trigger lever sets) that rail 204 may descend while chassis remain installed.

Figure 10:
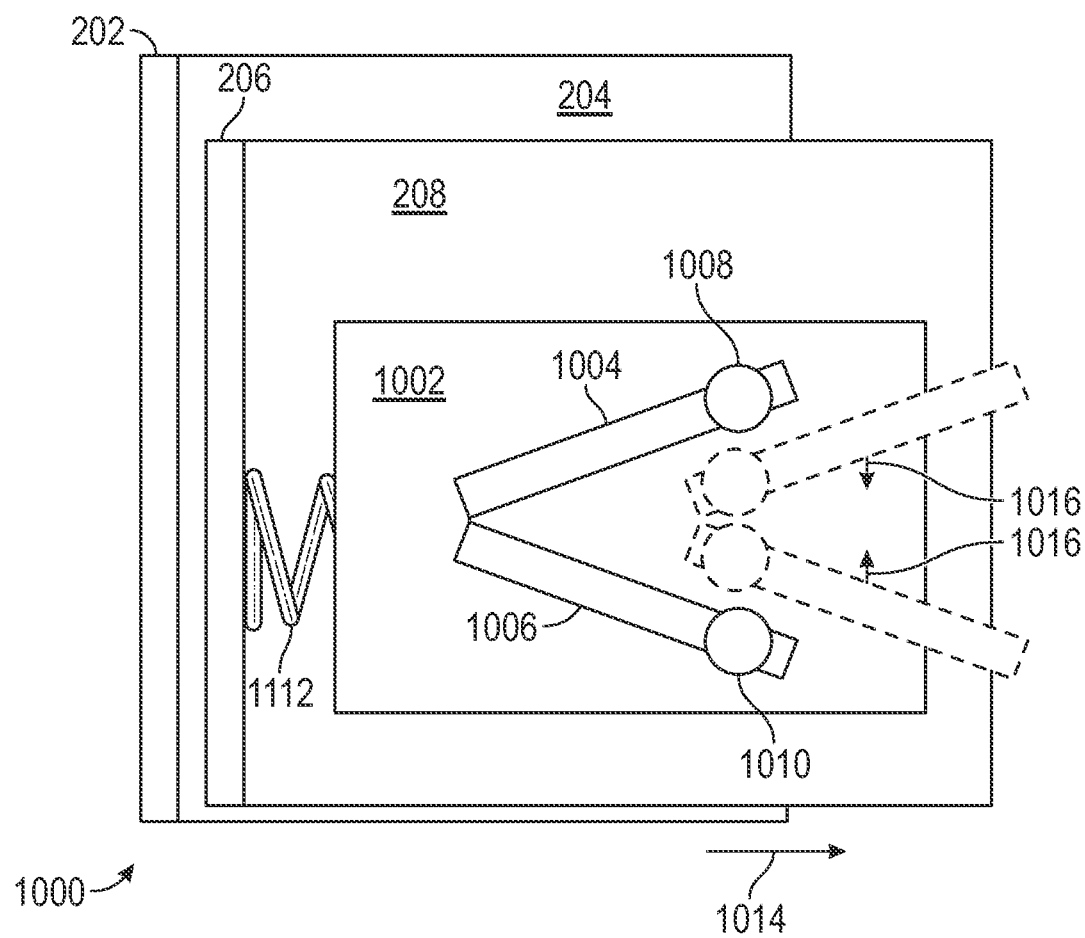
FIG. 10 is a side view of an embodiment of a trigger set.

FIG. 10 is a side view of an embodiment of a trigger set 1000 that may supply the function of, e.g., trigger set 210A. In FIG. 10, trigger 1000 in is in unlocked position. Trigger 1000 includes a plate 1002 with angled slots 1004, 1006. A pin 1008 connected to dynamic rail 204 (transparent) and dynamic bar 202 and plate 1002 travels within slot 1004. A pin 1010 connected to static rail 208 and plate 1002 travels within slot 1006. A spring 1012 biases plate 1002 to the extended position. In the embodiment, slots 1004, 1006 are angled such that when plate 1002 is moved in direction 1014 to the extended position, pins 1006, 1008 move within slots 1004, 1006 and are forced together 1016 to the positions indicated using dashed pins (the corresponding translation of plate 1002 is not shown for clarity). The relative movement of pins 1006, 1008 causes dynamic rail 204 and dynamic bar 202 to move to the locked position.

Figure 11:
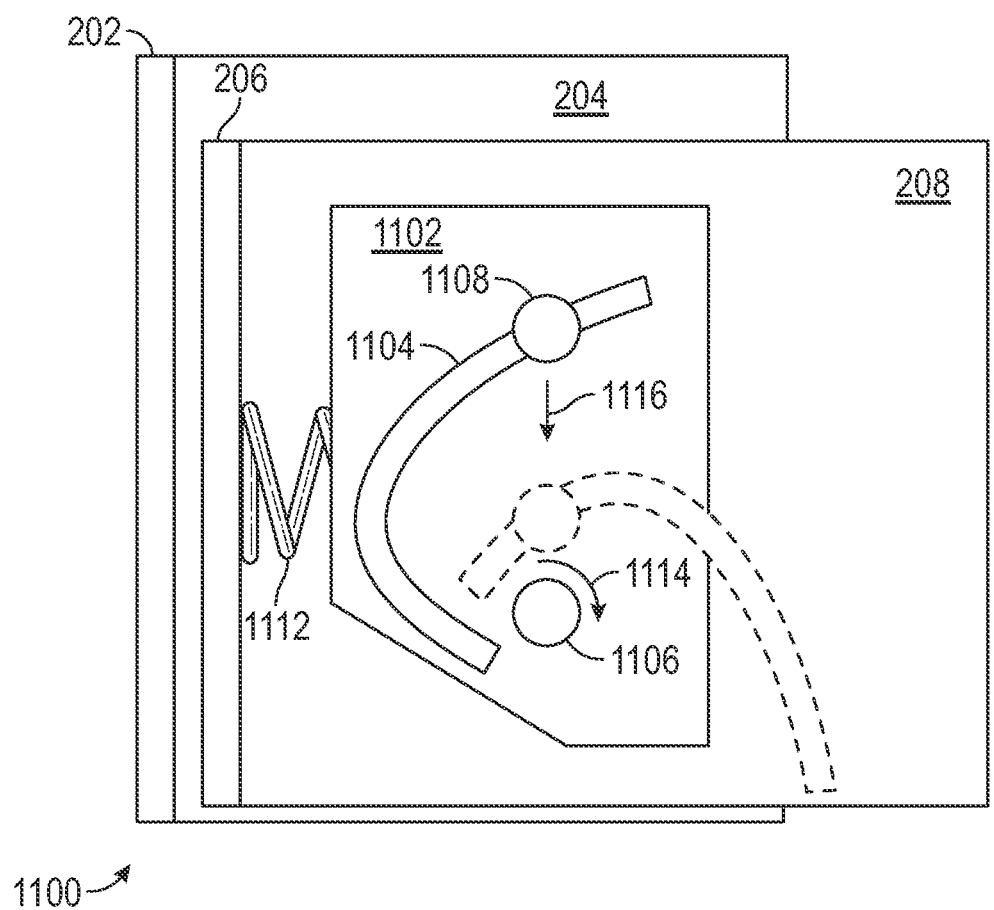
FIG. 11 is a side view of an embodiment of a trigger set.

FIG. 11 is a side view of an embodiment of a trigger set 1100 that may supply the function of, e.g., trigger set 210A. In FIG. 11, trigger 1100 is in the unlocked position. Trigger 1100 includes a plate 1102 including pin slot 1104. Plate 1102 is pivotally connected to static rail 208 about, e.g., a pin 1106. A pin 1108 connects dynamic rail 204 to plate 1102 and travels within slot 1104. A spring 1112 biases plate 1102 to pivot 1114 with respect to the first rail to the extended position. In the embodiment, slot 1104 is oriented such that when plate 1102 pivots 1114 from the depressed position to the extended position, pin 1108 is forced 1116 toward the pivotal connection 1106, causing dynamic rail 208 to move to the locked position indicated by dashed lines for the pin and slot (the corresponding rotation of plate 1102 is not shown for clarity).

Embodiments may be adapted to work for any number of chassis slots within a rack, and any number of different rack layouts. In addition, a user may reset an embodiment from the front of the rack by removing a chassis and replacing it with a blank fashioned to depress trigger lever set 210, allowing a second chassis to be removed.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
   a rack including first and second chassis positions;
   a first chassis provided with a first hook;
   a second chassis provided with a second hook;
   an elongate first rail connected to the rack;
   an elongate second rail including a first block corresponding to the first chassis position and including a second block corresponding to the second chassis position, the second rail in moving between an unlocked position and a locked position causing the first and second blocks to move between unlocked and locked positions; and
   a first trigger corresponding to the first chassis position and including a first spring biasing the first trigger to an extended position, and a second trigger corresponding to the second chassis position and including a second spring biasing the second trigger to the extended position, wherein:
   when the first and second chassis are fully inserted into the respective first and second chassis positions, the first trigger and the second trigger are depressed, and the second rail and first and second blocks are in the unlocked positions, and
   upon the subsequent removal of the first chassis, the first trigger is moved by the first spring from a depressed position to the extended position causing the second rail and the first and second blocks to move to the locked positions in which the second block is disposed within the second hook such that the second chassis is prevented from being removed from the second chassis position.

2. The apparatus of claim 1, wherein the first spring is pivotally connected by a first arm to the first rail and pivotally connected by a second arm to a second rail, the first spring configured to draw the first and second arms together such that the first trigger is biased to the extended position and the second rail is biased to the locked position.

3. The apparatus of claim 2, wherein the first trigger being moved by the first spring from a depressed position to an extended position includes a portion of the first spring moving from the depressed position to the extended position.

4. The apparatus of claim 2, wherein the first arm and the second arm are pivotally connected by a pin and the first spring includes a coil spring provided about the pin.

5. The apparatus of claim 1 further including a third spring associated with the second rail and configured to bias the second rail to the unlocked position, wherein the third spring is configured such that the bias created by either of the first or second springs is sufficient to overcome the bias of the third spring and cause the second rail to move to the locked position.

6. The apparatus of claim 1, wherein the first trigger and the second trigger are configured such that each include: a plate including a v-shaped slot, a first pin connected to the first rail and traveling within a first side of the v-shaped slot, a second pin connected to the second rail and traveling within a second side of the v-shaped slot, and a spring biasing the plate to the extended position, wherein: the v-shaped slot is oriented such that when the plate is moved from the depressed to the extended position, the first pin and the second pin are forced together, causing the second rail to move to the locked position.

7. The apparatus of claim 1, wherein the first trigger and the second trigger are configured such that each include: a plate including pin slot and pivotally connected to the first rail, a pin connected to the second rail and traveling within the pin slot, and a spring biasing the plate to pivot with respect to the first rail to the extended position, wherein: the pin slot is oriented such that when the plate pivots from the depressed position to the extended position the pin is forced toward the pivotal connection, causing the second rail to move to the locked position.

8. An apparatus comprising:
a first hook configured to be attached to a first chassis;
a second hook configured to be attached to a second chassis;
an elongate first rail configured to be connected to a rack including a first chassis position and a second chassis position;
an elongate second rail including a first block corresponding to the first chassis position and including a second block corresponding to the second chassis position, the second rail, in moving between an unlocked position and a locked position, causing the first and second blocks to move between unlocked and locked positions; and
a first trigger corresponding to the first chassis position and including a first spring biasing the first trigger to an extended position, and a second trigger corresponding to the second chassis position and including a second spring biasing the first trigger to the extended position, wherein:
when the first rail is connected to a rack and first and second chassis are fully inserted into the respective first and second chassis positions in the rack, and the first trigger and the second trigger are depressed, and the second rail and first and second blocks are in the unlocked positions, upon the subsequent removal of the first chassis, the first trigger is moved by the first spring from a depressed position to an extended position causing the second rail and the first and second blocks to move to the locked positions in which the second block is disposed within the second hook such that the second chassis is prevented from being removed from the second chassis position.

9. The apparatus of claim 8, wherein the first spring is pivotally connected by a first arm to the first rail and pivotally connected by a second arm to a second rail, the first spring configured to draw the first and second arms together such that the trigger is biased to the extended position and the second rail is biased to the locked position.

10. The apparatus of claim 9, wherein the first trigger being moved by the first spring from a depressed position to an extended position includes a portion of the first spring moving from the depressed position to the extended position.

11. The apparatus of claim 9, wherein the first arm and the second arm are pivotally connected by a pin and the spring includes a coil spring provided about the pin.

12. The apparatus of claim 8 further including a third spring associated with the second rail and configured to bias the second rail to the unlocked position, wherein the third spring is configured such that the bias created by either of the first or second springs is sufficient to overcome the bias of the third spring and cause the second rail to move to the locked position.

13. The apparatus of claim 8, the first trigger and the second trigger each including:
a plate including a v-shaped slot, a first pin connected to the first rail and traveling within a first side of the v-shaped slot, a second pin connected to the second rail and traveling within a second side of the v-shaped slot, and the plate being spring-biased to the extended position, and wherein:
the plate is spring-biased to the extended position, and
the v-shaped slot is oriented such that when the plate is moved from the depressed to the extended position, the first pin and the second pin are forced together, causing the second rail to move to the locked position.

14. The apparatus of claim 8, the first trigger and the second trigger each including:
a plate pivotally connected to the first rail and including a pin slot, a pin connected to the second rail and traveling within the pin slot, and a spring biasing the plate to pivot with respect to the first rail to the extended position, wherein:
the plate is spring-biased to pivot with respect to the first rail to the extended position, and
the pin slot is oriented such that when the plate pivots from the depressed position to the extended position the pin is forced toward the pivotal connection, causing the second rail to move to the locked position.

* * * * *